United States Patent [19]

Nakamura

[11] Patent Number: 5,584,064
[45] Date of Patent: Dec. 10, 1996

[54] CONVERTER CIRCUIT FOR SATELLITE BROADCASTING RECEIVERS HAVING MIXER ISOLATION

[75] Inventor: Makio Nakamura, Osaka, Japan

[73] Assignee: Sharp Kabushiki Kaisha, Osaka, Japan

[21] Appl. No.: 363,023

[22] Filed: Dec. 23, 1994

[30] Foreign Application Priority Data

Dec. 24, 1993 [JP] Japan .................................. 5-327373

[51] Int. Cl.⁶ .................................................. H04B 1/16
[52] U.S. Cl. ........................... 455/293; 455/3.2; 455/325; 455/333
[58] Field of Search .......................... 455/3.2, 281, 289, 455/293, 291, 313, 318, 319, 323, 325, 330, 333

[56] References Cited

U.S. PATENT DOCUMENTS

| | | | |
|---|---|---|---|
| 5,204,984 | 4/1993 | Fujisaki et al. | 455/319 |
| 5,239,685 | 8/1993 | Ude et al. | 455/333 |

FOREIGN PATENT DOCUMENTS

| | | |
|---|---|---|
| 263201 | 3/1990 | Japan . |
| 2220538 | 1/1990 | United Kingdom . |

Primary Examiner—Chi H. Pham

[57] ABSTRACT

A horizontally polarized wave signal is amplified in low-noise by two first LNAs connected in series to each other. The resulting low-noise amplified signal is entered into a first high electron mobility transistor mixer via a first band-pass filter. The first high electron mobility transistor mixer converts the signal into an intermediate frequency signal based on local power fed from a local oscillator via a Y-type distribution circuit and a first directional filter, and provides the converted signal as an output thereof. Meanwhile, a vertically polarized wave signal is amplified in low-noise by two second LNAs connected in series to each other. The resulting low-noise amplified signal is entered into a second high electron mobility transistor mixer via a second band-pass filter. The second high electron mobility transistor mixer converts the signal into an intermediate frequency signal based on local power fed from the local oscillator via the Y-type distribution circuit and a second directional filter, and provides the converted signal as an output thereof.

3 Claims, 7 Drawing Sheets

5,584,064

CONVERTER CIRCUIT FOR SATELLITE BROADCASTING RECEIVERS HAVING MIXER ISOLATION

BACKGROUND OF THE INVENTION

1. Field of the Invention

The present invention relates to a converter circuit to be used in satellite broadcasting receivers and, more particularly, to a converter circuit used in low noise block-down converters (hereinafter, referred to as LNB). As seen in FIG. 4 showing an example of the satellite broadcasting reception systems, the present invention is directed for example to use in an outdoor Ku-band LNB.

In FIG. 4, there are shown an antenna 61 receiving a signal in a range of 11.7 GHz–12.2 GHz for example; a Kuband LNB 62 for converting the received signal to a range of 950 MHz–1450 MHz for example; an indoor receiver 64 to be connected to the LNB 62 by a coaxial cable 63; and a television 65 to be connected to the indoor receiver 64. The indoor receiver 64 comprises a DBS tuner 66, an FM demodulator 67, a video and audio circuit 68, and an RF modulator 69.

FIG. 5 shows a circuit block diagram of this LNB. In FIG. 5, there are shown first and second LNAs (low-noise amplifiers) 71 and 81 respectively having horizontal and vertical signals in a range of 11.7 GHz–12.2 GHz input thereto for example; first and second BPFs (band-pass filters) 72 and 82; first and second HEMT (high electron mobility transistor) mixers 73 and 83; a pair of first amplifiers 74; an L.O. (local oscillator) 76 outputting a local oscillator signal of 10.75 GHz for example; power supply 77; a pair of temperature compensating circuits 78; and a pair of second amplifiers 79.

FIG. 6 shows an example of the constructional view of this LNB. The present invention is to be embodied for the part of LNAs 71 and 81, BPFs 72 and 82, MIXs (mixers) 73, 83, and L.O. 76 of the block diagram of FIG. 5, and applied principally to the circuit board of FIG. 6. In FIG. 6, there are shown a chassis 91 for the LNB unit; an input waveguide 92; the circuit board 93 on which the circuit of FIG. 5 is mounted; a shield plate 94; the local oscillator 95, 76 of FIG. 5; and an output terminal 96.

2. Description of the Prior Art

Conventionally, there has been developed a converter circuit as shown in FIG. 2. This converter circuit is widely used for LNBs designed for reception of the European ASTRA satellite and the U.S. Ku-band satellite. For reception of the ASTRA satellite, the converter circuit first identifies and low-noise amplifies a horizontally polarized wave signal and a vertically polarized wave signal with their input frequency ranging from 10.7 GHz to 11.8 GHz (enhance specification), and then converts them into IF (intermediate frequency) signals (950 MHz to 2050 MHz). In more detail, a horizontally polarized wave signal from an input terminal $T_3$ is amplified by low-noise amplifiers (hereinafter, referred to as LNA) 21a, 21b of a two-stage construction of HEMTs (high electron mobility transistors) and then converted into an IF signal by an HEMT-incorporated mixer (hereinafter, referred to as HEMT mixer) 23 through a band-pass filter 22 based on oscillator power fed from a local oscillator 26. Thereafter, an $IF_3$ output of the HEMT mixer 23 is amplified to a signal of an appropriate level by an unshown succeeding-stage amplifier provided for amplifying IF signals (hereinafter, referred to as IF amplifier).

Meanwhile, a vertically polarized wave signal from an input terminal $T_4$ is amplified by LNAs 31a, 31b of a HEMT two-stage construction, and then converted into an IF signal by an HEMT mixer 33 through a band-pass filter 32 based on oscillator power fed from the local oscillator 26. Thereafter, an $IF_4$ output of the HEMT mixer 33 is amplified to a signal of an appropriate level by an unshown succeeding-stage IF amplifier. It is noted that oscillator power is fed from an output terminal 26a of the local oscillator 26 to the HEMT mixers 23, 33 via a Y-type distribution circuit 25 with the aid of coupling capacitors 24, 34, respectively.

In addition, reference numerals 28 and 38 denote bias circuits for inputting a bias voltage to the LNAs 21a, 21b and 31a, 31b, respectively. $G_3$, $G_4$ denote gate bias supply terminals for inputting a gate bias voltage to the HEMT mixers 23, 33, respectively. Reference numeral 27 denotes a power supply terminal for supplying power to the local oscillator 26.

In another converter circuit as shown in FIG. 3, a horizontally polarized wave signal from an input terminal $T_5$ is amplified by LNAs 41a, 41b, 41c of an HEMT three-stage construction, and then converted into an IF signal by a diode mixer 43 through a band-pass filter 42 based on oscillator power fed from a local oscillator 46. Meanwhile, a vertically polarized wave signal from an input terminal $T_6$ is amplified by LNAs 51a, 51b, 51c of an HEMT three-stage construction, and then converted into an IF signal by a diode mixer 53 through a band-pass filter 52 based on oscillator power fed from the local oscillator 46. It is noted that oscillator power is fed from an output terminal 46a of the local oscillator 46 to the diode mixers 43, 53 via a Y-type distribution circuit 45 with the aid of directional filters 44, 54, respectively.

In addition, reference numerals 48 and 58 denote bias circuits for inputting a bias voltage to the LNAs 41a, 41b, 41c and the LNAs 51a, 51b, 51c, respectively. $G_5$, $G_6$ denote gate bias supply terminals for inputting a gate bias voltage to the diode mixers 43, 53, respectively. Reference numeral 47 denotes a power supply terminal for supplying power to the local oscillator 46.

The converter circuit of FIG. 3 differs from the converter circuit of FIG. 2 in that the HEMTs are provided in not two-stage but three-stage construction, that the mixers used are not HEMT mixers but diode mixers 43, 53 using diodes 49, 59, and that not coupling capacitors 24, 34 but directional filters 44, 54 incorporating a ring filter are used to supply the power fed from the local oscillator 46 to the diode mixers 43, 53.

The converter circuit of FIG. 2 incorporates coupling capacitors 24, 34 that supply oscillator power to the HEMT mixer 23 for horizontally polarized wave signals and the HEMT mixer 33 for vertically polarized wave signals, respectively. Accordingly, isolation between an output of the HEMT mixer 23 and an output of the HEMT mixer 33 is dependent on these coupling capacitors 24, 34. That is, the isolation of IF signals of the 1 to 2 GHz band is dependent on constants of the coupling capacitors 24, 34. However, due to a limitation in blocking IF signals by decreasing the constants of the coupling capacitors 24, 34, the isolation characteristic for IF signals is limited, to a disadvantage.

Also, the isolation of 10 to 13 GHz RF signals, which are a horizontally polarized wave signal and a vertically polarized wave signal, is dependent on the isolation of inputs and outputs of the HEMTs used in the HEMT mixers 23, 33. It is noted that the coupling capacitors 24, 34 are in actual cases ineffective for the isolation of RF (radio frequency)

signals because of too high frequencies of the RF signals. Accordingly, a problem is the mass-produced HEMTs would have variations in their input-output isolation characteristic for RF signals, which in turn would cause variations in the isolation characteristic of horizontally and vertically polarized wave signals.

The degree of cross polarization isolation (which refers to, for example, the amount of reception of a vertically polarized wave signal on the basis of the degree of reception of a horizontally polarized wave signal as viewed at the horizontally polarized wave output terminal in reception of a horizontally polarized wave signal) as an LNB using the converter circuit of FIG. 2 is at most 25 dB. In mass production, taking into consideration variations of the degree, the performance as a product would be naturally estimated to be 20 to 23 dB. Thus, a further problem is that the characteristic of 27 to 30 dB required for systems that perform digital signal processing could not be met.

The converter circuit of FIG. 3 uses diode mixers 43, 53 having no conversion gain. Therefore, in order to obtain the total gain and noise factor performance of the LNB, one has no choice but to increase the number of HEMTs that constitute the LNAs from two to three stages. This would result in an increase in the number of HEMTs, which are expensive semiconductor devices, which leads to another problem of increased cost.

The increase in the number of HEMTs would cause the printed circuit board for mounting components such as the HEMTs thereon to be also increased in size. Since the printed circuit board is also expensive, the increase in size would be an obstacle to the downsizing of the converter circuit as well as to cost reduction, resulting in still further disadvantages.

SUMMARY OF THE INVENTION

The object of the present invention is therefore to provide a converter circuit which allows cost reduction and downsizing by its capability of attaining a 27 dB or more isolation characteristic (the degree of isolation between horizontally polarized waves and vertically polarized waves) for a horizontally polarized wave signal and a vertically polarized wave signal upon reception of each signal, and by minimizing the number of components.

In order to achieve the aforementioned object, the converter circuit according to the present invention is characterized by comprising:

two first high electron mobility transistor units connected in series to each other;

a first band-pass filter for eliminating signals of a specified band from a signal received from the latter-stage of the two first high electron mobility transistor units;

a first high electron mobility transistor mixer for converting the signal derived from the first band-pass filter, which does not include signals of the specified band, into an intermediate frequency signal as an output thereof;

a first directional filter for supplying oscillator power to the first high electron mobility transistor mixer;

two second high electron mobility transistor units connected in series to each other;

a second band-pass filter for eliminating signals of a specified band from a signal received from the latter-stage of the two second high electron mobility transistor units;

a second high electron mobility transistor mixer for converting the signal derived from the second band-pass filter, which does not includ signals of the specified band, into an intermediate frequency signal as an output thereof; and a second directional filter for supplying oscillator power to the second high electron mobility transistor mixer.

According to the converter circuit of the present invention, for example, when a horizontally polarized wave signal is entered into two first HEMT (high electron mobility transistor) units connected in series to each other and a vertically polarized wave signal is entered into two second HEMT units connected in series to each other, the horizontally polarized wave signal passes through the first HEMT units and has signals of a specified band eliminated by the first band-pass filter, and then enters into the first HEMT mixer. The first HEMT mixer converts the signal, which does not include signals of the specified band, into an IF (intermediate frequency) signal based on oscillator power fed from the first directional filter, as an output. On the other hand, the vertically polarized wave signal passes through the second HEMT units and has signals of a specified band eliminated by the second band-pass filter, and then enters into the second HEMT mixer. The second HEMT mixer converts the signal, which does not include signals of the specified band, into an IF signal based on oscillator power fed from the second directional filter, as an output. In this process, the first and second directional filters isolate RF (radio frequency) signals of the horizontally polarized wave signal and the vertically polarized wave signal. As a result, the isolation characteristic between horizontally polarized wave and vertically polarized wave signals can be improved with the aid of both the blocking characteristic of the first and second directional filters and the input-output isolation characteristic of the first and second HEMT mixers.

The first and second directional filters may be formed from microstrip patterns of a printed circuit board, in which case such components as capacitors are unnecessary. Accordingly, the isolation characteristic will never be affected by constants or performance of such components as capacitors. This suppresses performance deterioration caused by variations due to mass-production. As a result, the isolation characteristic between a horizontally polarized wave signal and a vertically polarized wave signal, that is, the cross polarization isolation characteristic is improved.

Thus, the degree of isolation between horizontally polarized wave and vertically polarized waves can be improved and variation in the degree of isolation can be suppressed.

According to an embodiment of the present invention, the first and second high electron mobility transistor units are amplifiers and the first and second high electron mobility transistor mixers are active mixers having a conversion gain.

In the converter circuit of this embodiment, the first and second HEMT units are amplifiers while the first and second HEMT mixers are active mixers having a conversion gain. Therefore, a desired gain can be obtained by a three-stage construction of two HEMT units and an HEMT mixer. As a result, the total gain and noise factor performance required for this converter circuit can be obtained without the need of increasing the number of HEMT units from two to three stages. Hence, the number of HEMTs, which are expensive semiconductor devices that constitute the HEMT units, can be reduced, whereby cost can be reduced. The size of the printed circuit board on which components are to be mounted can also be reduced as a result of the reduction in the number of HEMT units.

Accordingly, there can be provided a converter circuit which is low in cost and which allows downsizing.

Also, according to an embodiment of the present invention, the first and second directional filters are band-pass filters.

In the converter circuit of this embodiment, the first and second directional filters are band-pass filters. Therefore, the first and second directional filters have a passing characteristic to the frequency of the local oscillator and a blocking characteristic against horizontally and vertically polarized wave reception signals and IF signals. As a result, the blocking characteristic of the first and second directional filters against horizontally polarized wave and vertically polarized wave signals is improved.

Consequently, there can be provided a converter circuit which is substantially improved in the isolation characteristic between a horizontally polarized wave signal and a vertically polarized wave signal.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, the converter circuit of the present invention will be described in more detail as one embodiment thereof by way of example.

Figure 1:
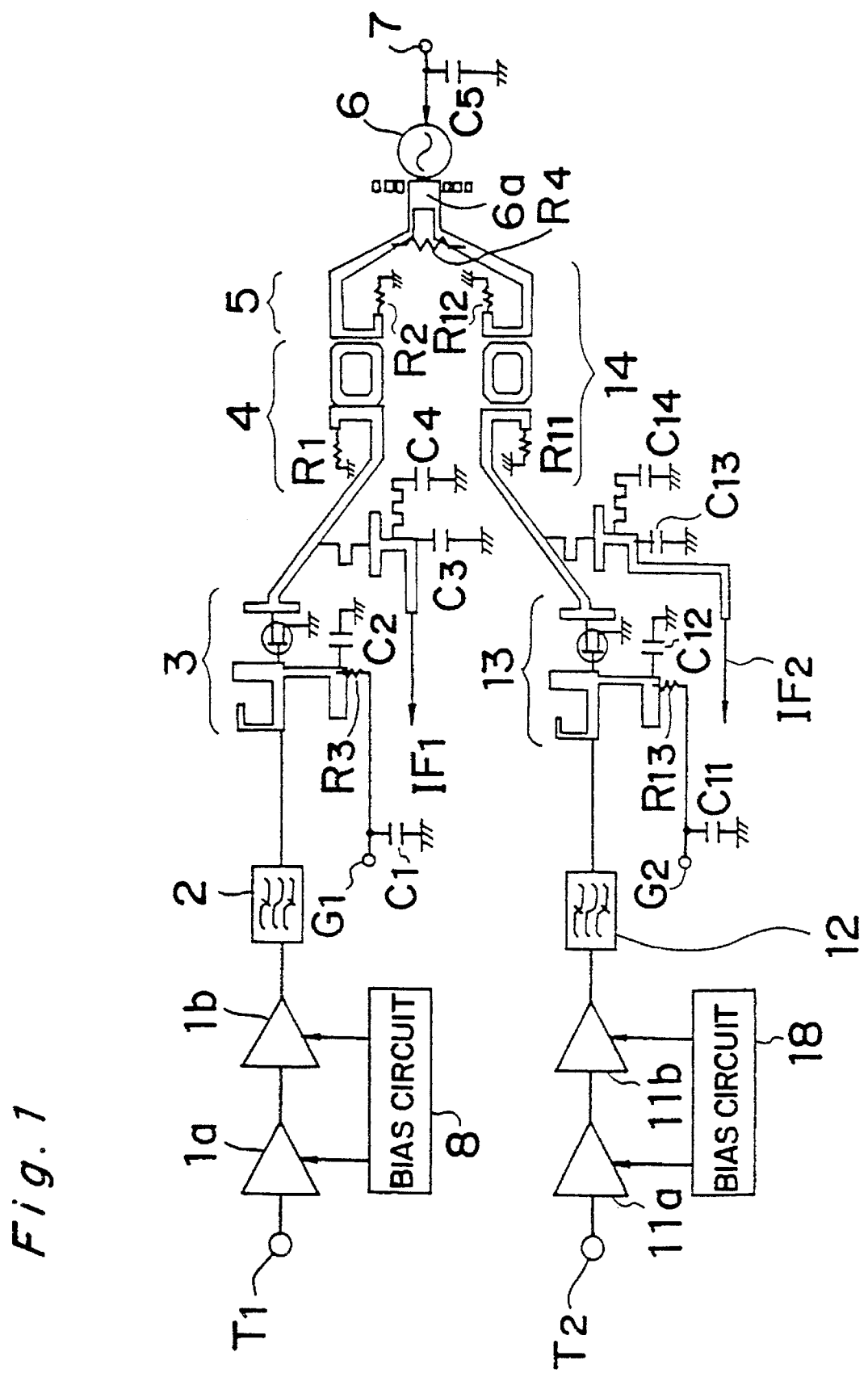
FIG. 1 is a view showing the circuit construction of the converter circuit according to an embodiment of the present invention.
Figure 2:
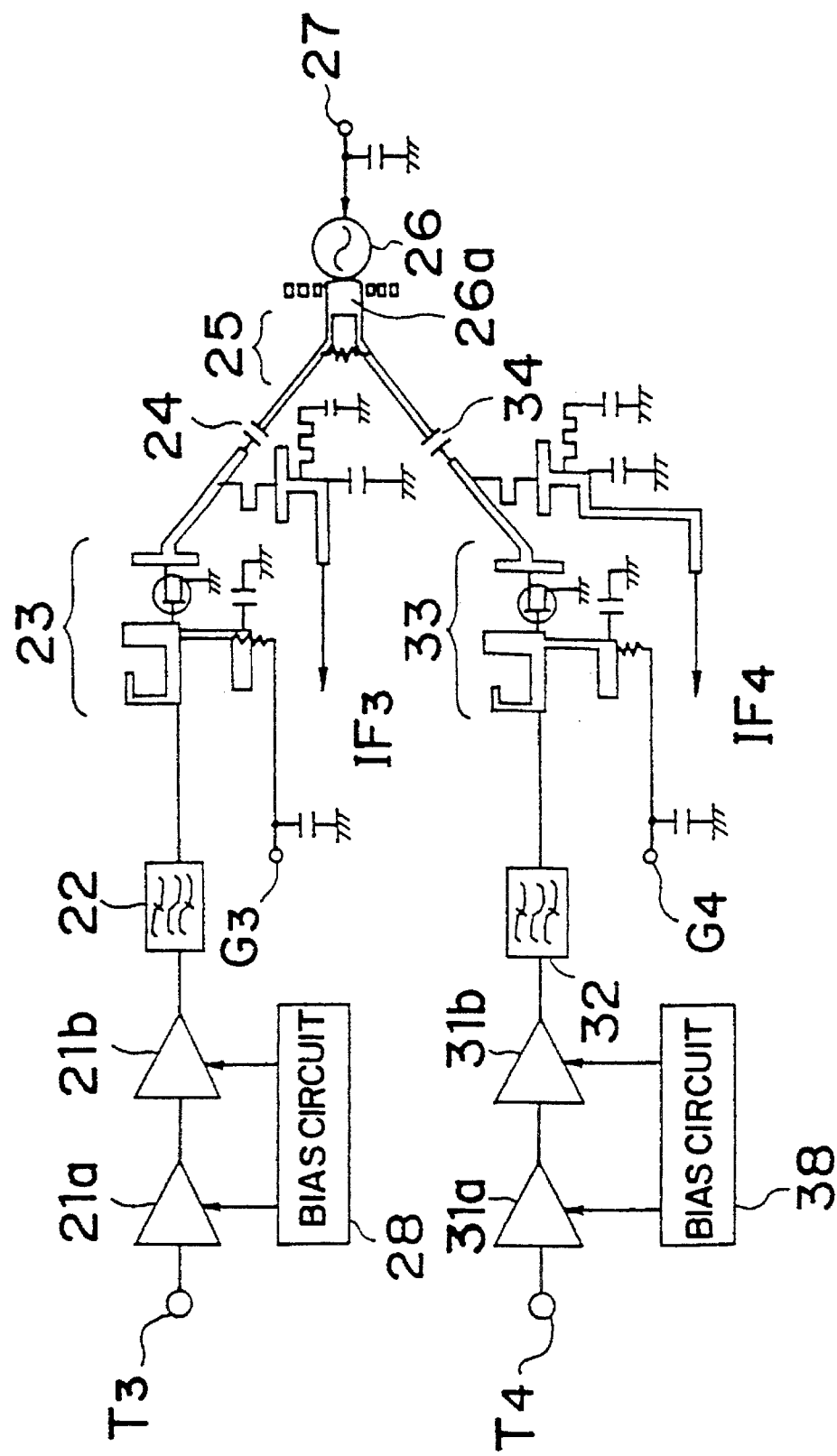
FIG. 2 is a view showing the circuit construction of a conventional converter circuit.
Figure 3:
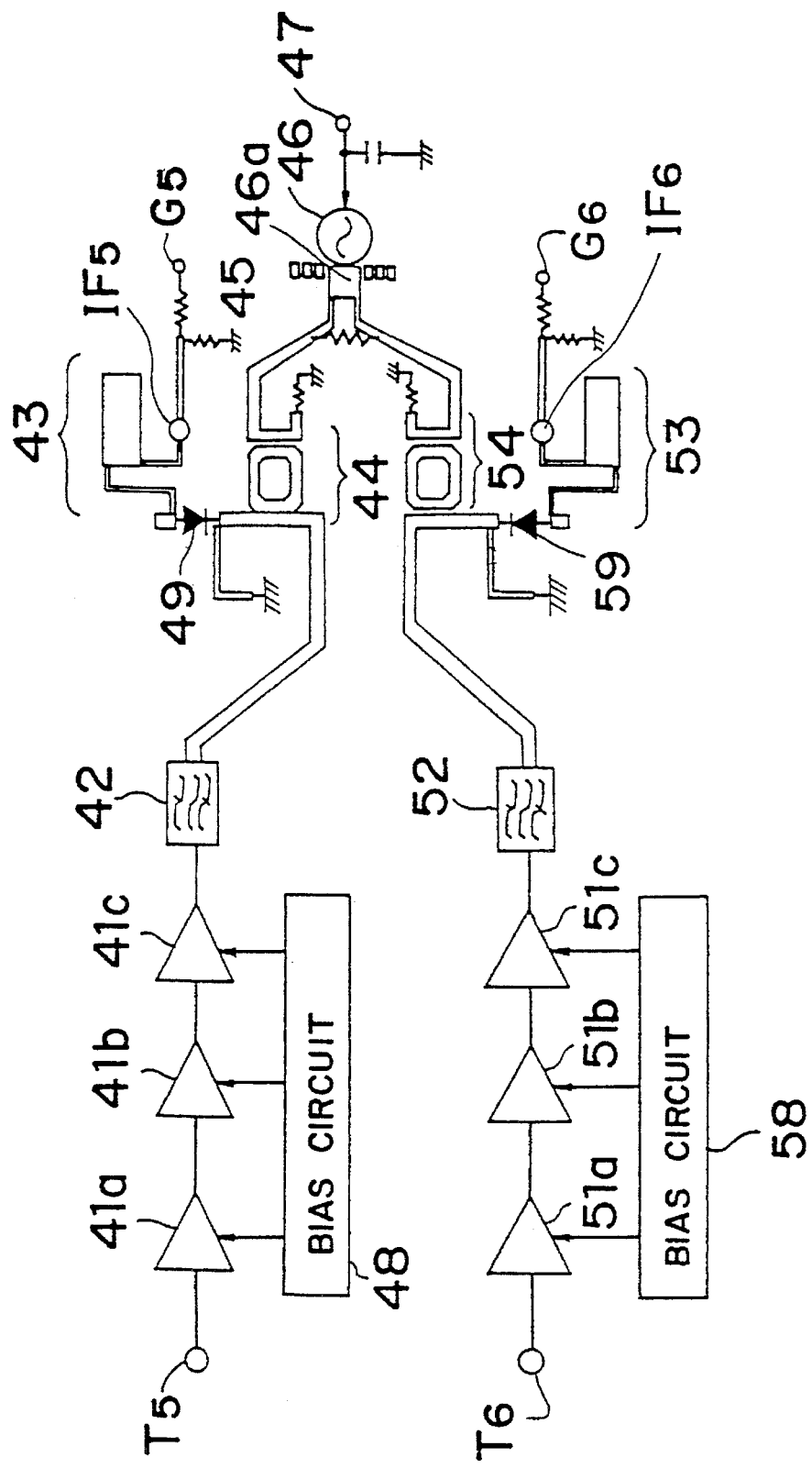
FIG. 3 is a view showing the circuit construction of another conventional converter circuit.
Figure 4:
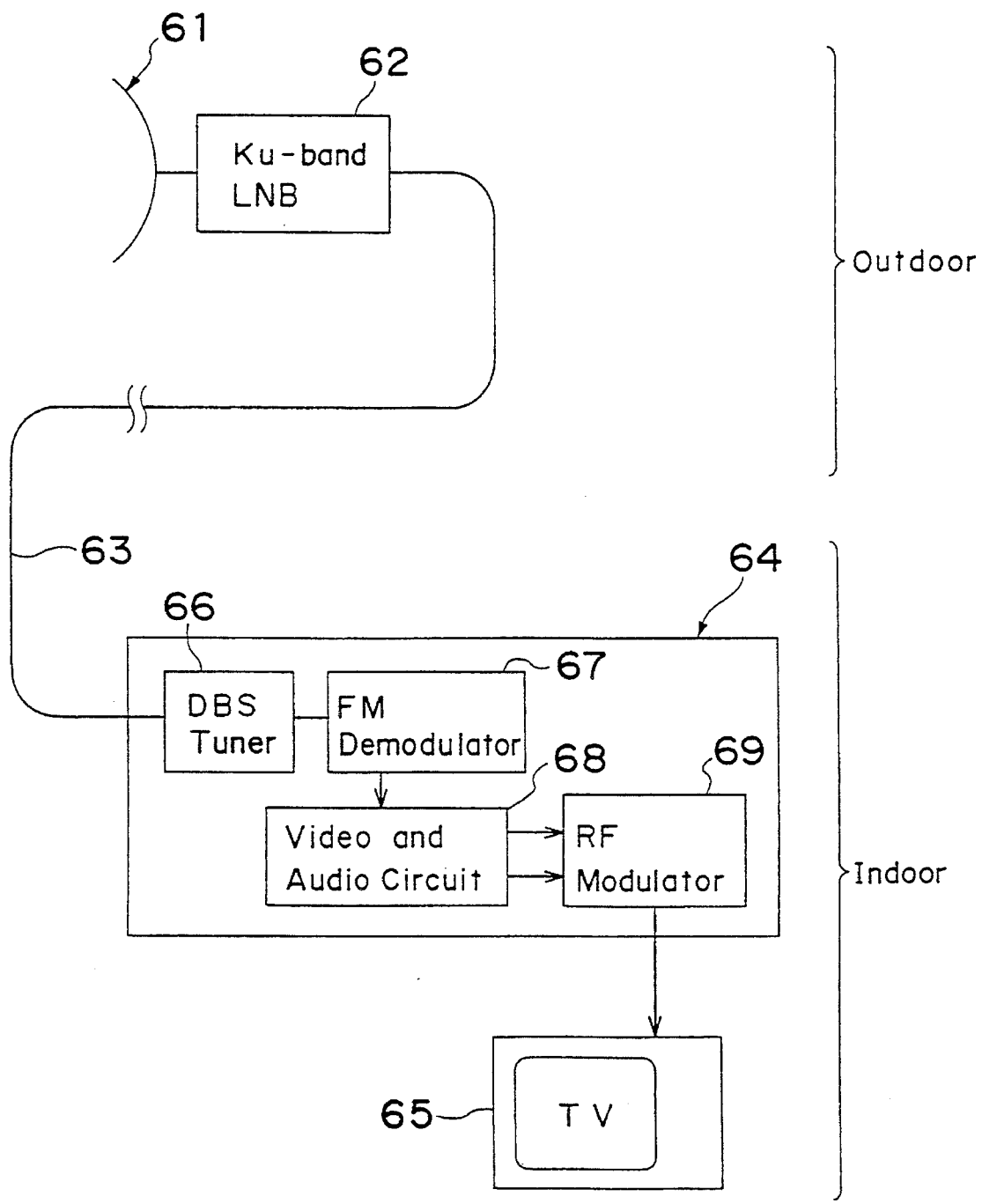
FIG. 4 is a view showing an example of the satellite broadcasting reception system.
Figure 5:
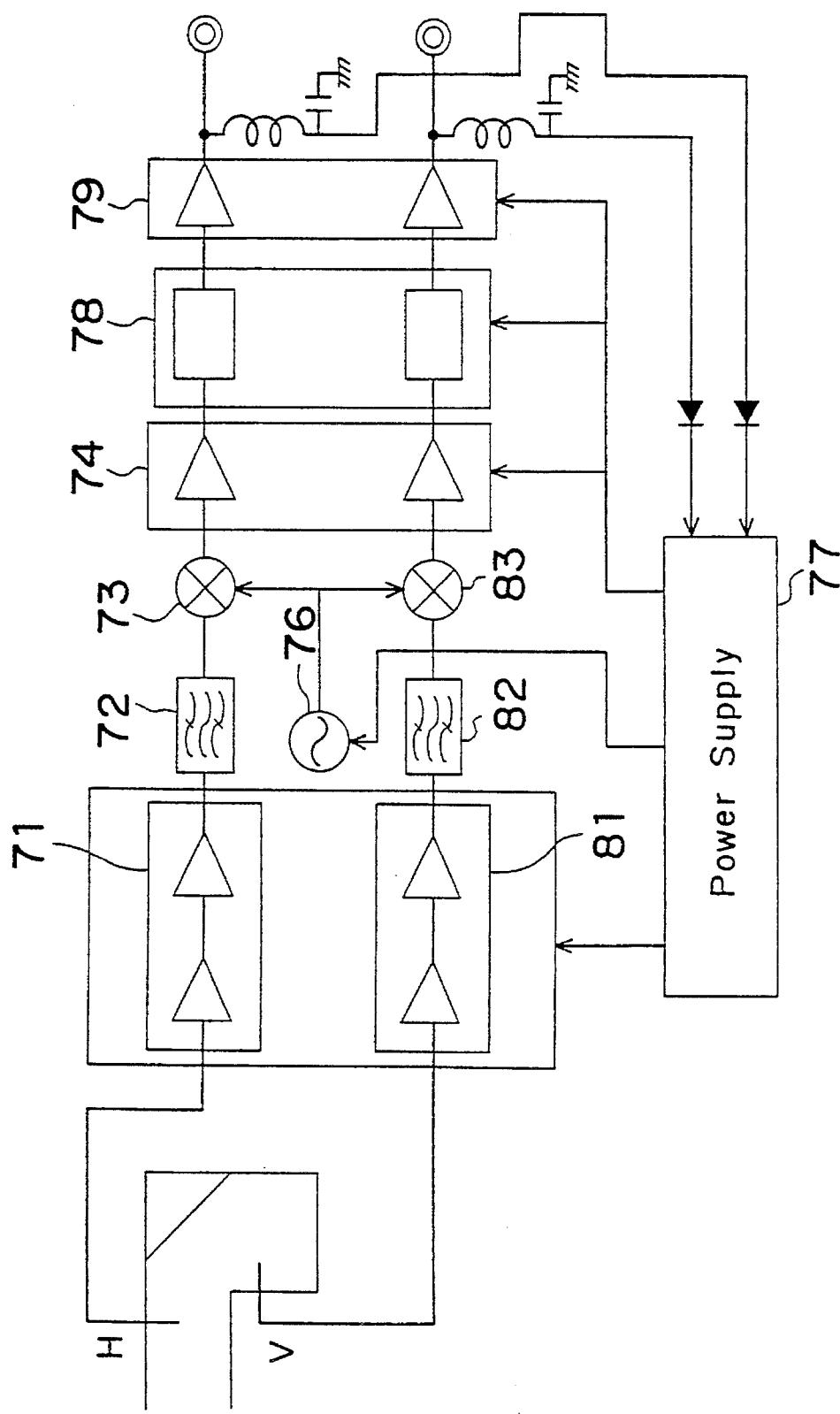
FIG. 5 is a view showing a circuit block diagram of LNB.
Figure 6:
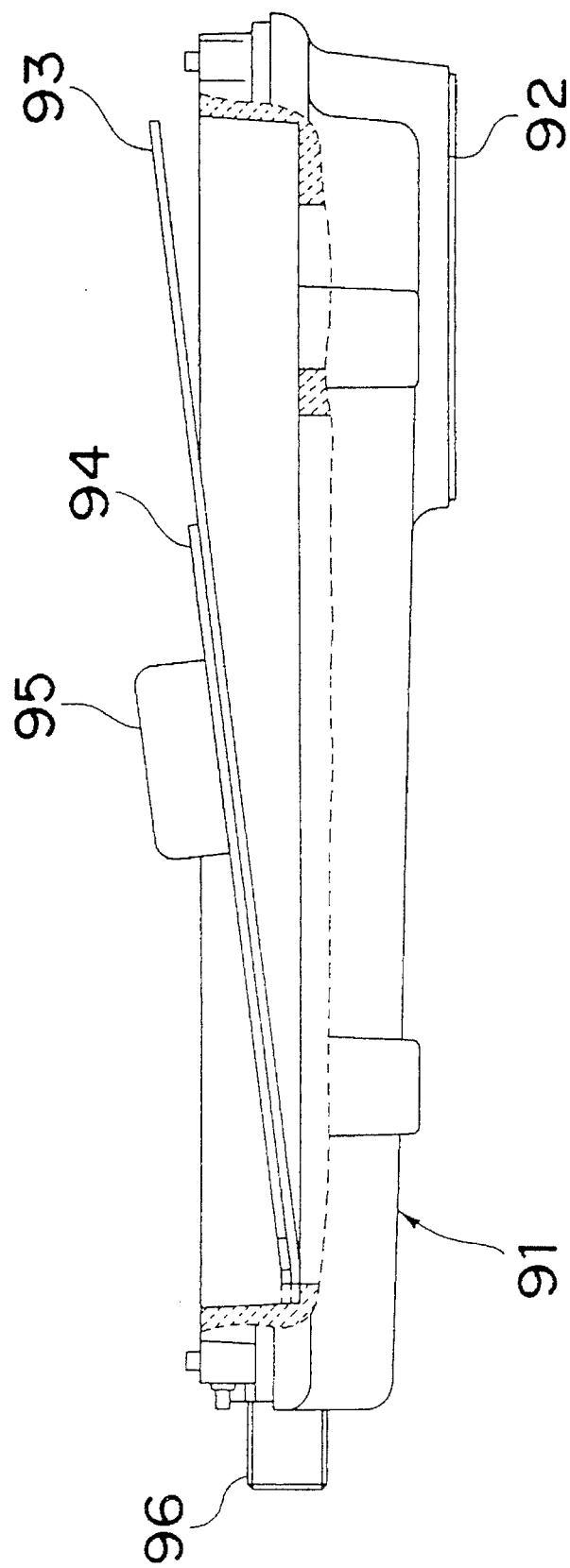
FIG. 6 is a view showing an example of the constructional view of LNB.

FIG. 1 shows the circuit construction of the converter circuit according to an embodiment of the present invention. The printed circuit board of this converter circuit is formed of a 0.8 mm thick Teflon material, and the wiring is implemented by microstrip lines. The board size is about 50×100 mm, and all the circuits are made up on one board.

In FIG. 1, there are shown two first LNAs (low noise amplifiers) 1a, 1b which are connected in series to each other and which exemplify the HEMT unit that amplifies a signal derived from an input terminal $T_1$; a first band-pass filter 2 for image elimination, which eliminates signals of a specified band upon receiving a signal from the latter-stage first LNA 1b; a first HEMT mixer 3 for converting the signal derived from the first band-pass filter 2, which does not include the signals of the specified band, into an IF signal as an output thereof; and a first directional filter 4, one end of which is connected to the output of the first HEMT mixer 3. There are further shown second LNAs 11a, 11b which are connected in series to each other and which serve as HEMT units for amplifying a signal derived from an input terminal $T_2$; a second band-pass filter 12 for image elimination, which eliminates signals of a specified band upon receiving a signal from the latter-stage second LNA 11b; a second HEMT mixer 13 for converting the signal derived from the second band-pass filter 12 which doses not include the signals of the specified band, into an IF signal as an output thereof; and a second directional filter 14, one end of which is connected to the output of the second HEMT mixer 13 and the other end of which is connected to a Y-type distribution circuit 5. It is noted that the first and second LNAs 1a, 1b, 11a, 11b and the first and second HEMT mixers 3, 13 are of circuitry containing HEMTs, and that the first and second HEMT mixers 3, 13 are active mixers having a conversion gain.

There are also shown the Y-type distribution circuit 5 which is connected to the other ends of the first and second directional filters 4, 14 and which distributes local power to the first and second directional filters 4, 14; and a local oscillator 6 connected to the Y-type distribution circuit 5 via an output terminal 6a. The Y-type distribution circuit 5 has a resistor $R_4$ connected to patterns that are branched to the first and second directional filters 4, 14. The Y-type distribution circuit distributes oscillator power evenly to the first and second HEMT mixers 3, 13, and functions to attain matching to the first and second HEMT mixers 3, 13. Also, the local oscillator 6 has the power supply connected thereto via a power supply terminal 7, and a capacitor $C_5$ connected between the power supply terminal 7 and the ground GND.

A bias voltage is entered from a bias circuit 8 to the first LNAs 1a, 1b. A gate bias supply terminal $G_1$ is connected to the input of the first HEMT mixer 3 via a resistor $R_3$, and a capacitor $C_1$ is connected between the gate bias supply terminal $G_1$ and the ground GND. A capacitor $C_2$ is connected between the input of the first HEMT mixer 3 and the ground GND, while capacitors $C_3$, $C_4$ are connected between a pattern that connects the first HEMT mixer 3 to the first directional filter 4, and the ground GND. A terminal resistor $R_1$ is connected between one end of the first directional filter 4 on the first HEMT mixer 3 side and the ground GND, while a terminal resistor $R_2$ is connected between the other end of the first directional filter 4 and the ground GND.

Meanwhile, a bias voltage is entered from a bias circuit 18 to the second LNAs 11a, 11b. A gate bias supply terminal $G_2$ is connected to the input of the second HEMT mixer 13 via a resistor $R_{13}$, and a capacitor $C_{11}$ is connected between the gate bias supply terminal $G_2$ and the ground GND. A capacitor $C_{12}$ is connected between the input of the second HEMT mixer 13 and the ground GND, while capacitors $C_{13}$, $C_{14}$ are connected between a pattern that connects the second HEMT mixer 13 to the second directional filter 14, and the ground GND. A terminal resistor $R_{11}$ is connected between one end of the second directional filter 14 on the second HEMT mixer 13 side and the ground GND, while a terminal resistor $R_{12}$ is connected between the other end of the second directional filter 14 and the ground GND.

Thus, the first and second directional filters 4, 14 are arranged to be band-pass filters of narrow band having such characteristics that they pass the frequency of the local oscillator 6 (e.g., 9.75 GHz for the ASTRA satellite, 10.75 GHz for the U.S. Ku-band) and block horizontally and vertically polarized wave reception signals and IF signals.

In the converter circuit of the above construction, for example for reception of the European ASTRA satellite, a horizontally polarized wave signal and a vertically polarized wave signal with their input frequency ranging from 10.7

GHz to 11.8 GHz are entered into the input terminals $T_1$, $T_2$, respectively. The horizontally polarized wave signal is amplified in low-noise to a degree of 20 to 24 dB by the first LNAs 1a, 1b, and thereafter signals of a specified band are eliminated by the first band-pass filter 2 for image elimination. Then, on receiving the signal from the first band-pass filter 2, which does not include signals of the specified band, the first HEMT mixer 3 converts it into an IF signal with frequency 950 MHz to 2050 MHz by oscillator power fed from the local oscillator 6 via the Y-type distribution circuit 5 and the first directional filter 4. Subsequently, an $IF_1$ output of the first HEMT mixer 3 is entered into an unshown succeeding-stage IF amplifier, where it is amplified to a signal of an appropriate level.

Meanwhile, the vertically polarized wave signal is amplified in low noise to a degree of 20 to 24 dB low noise by the second LNAs 11a, 11b, and thereafter signals of a specified band are eliminated by the second band-pass filter 12 for image elimination. Then, on receiving the signal from the second band-pass filter 12, which does not include signals of the specified band, the second HEMT mixer 13 converts it into an IF signal with frequency 950 MHz to 2050 MHz by oscillator power fed via the second directional filter 14. Subsequently, an $IF_2$ output of the second HEMT mixer 13 is entered into an unshown succeeding- stage IF amplifier, where it is amplified to a signal of an appropriate level.

In this process, the first and second directional filters 4, 14 pass the frequency of the local oscillator 6 but block horizontally and vertically polarized wave reception signals and IF signals. Besides, the noise figure characteristic of the converter circuit as an LNB depends on the noise figure and gain characteristic of HEMTs of two-stage construction of the first LNAs 1a, 1b and the second LNAs 11a, 11b, the passing loss of the succeeding first and second band-pass filters 2, 12 for use of image elimination, and the noise figure characteristic of the first and second HEMT mixers 3, 13. Thus, a successful noise figure characteristic can be obtained.

In addition, for reception of the U.S. Ku-band satellite, the principle of operation is the same as in the foregoing case except that the input frequency is 11.7 GHz to 12.2 GHz and that the output frequency is 950 MHz to 1450 MHz.

As described above, the first and second directional filters 4, 14 isolate RF signals of a horizontally polarized wave signal and a vertically polarized wave signal. As a result, the isolation characteristic between a horizontally polarized wave signal and a vertically polarized wave signal can be improved based on both the blocking characteristic of the first and second directional filters and the input-output isolation characteristic of the first and second HEMT mixers.

Further, the first and second directional filters may be formed from microstrip patterns of the printed circuit board, eliminating the need for such components as capacitors. Accordingly, the isolation characteristic will never be affected by the constants and performance of such components as capacitors. As a result, performance deterioration caused by variations due to mass production is suppressed, so that the isolation characteristic between a horizontally polarized wave signal and a vertically polarized wave signal, i.e., the cross polarization isolation characteristic, can be improved. Consequently, the degree of isolation between horizontally polarized waves and vertically polarized waves can be improved and variation in the degree of isolation can be reduced.

The first LNAs 1a, 1b band the second LNAs 11a, 11b and the first and second HEMT mixers 3, 13 make it possible to obtain desired total gain and noise factor performance, eliminating the need of increasing the number of LNAs. Thus, it becomes possible to reduce the number of HEMTs, which are expensive semiconductor devices, so that the cost can be reduced. The reduction in the number of LNAs in turn makes it possible to reduce the size of the printed circuit board for mounting components thereon, allowing cost reduction and downsizing.

Further, since the first and second directional filters 4, 14 are arranged to be band-pass filters of narrow band, the blocking characteristic against horizontally polarized wave and vertically polarized wave signals is improved, so that the isolation characteristic between a horizontally polarized wave signal and a vertically polarized wave signal is improved to a substantial extent. Thus, there can be provided a converter circuit having an isolation characteristic of 27 dB or more.

The isolation characteristic between a horizontally polarized wave signal and a vertically polarized wave signal has conventionally been 20 to 22 dB. By adding the blocking characteristic of the first and second directional filters 4, 14, about 7 to 10 dB to that, it is now possible to attain an isolation characteristic of 27 to 30 dB, so that the isolation characteristic of 27 dB or more can be realized for the LNB as a product.

Figure 7:
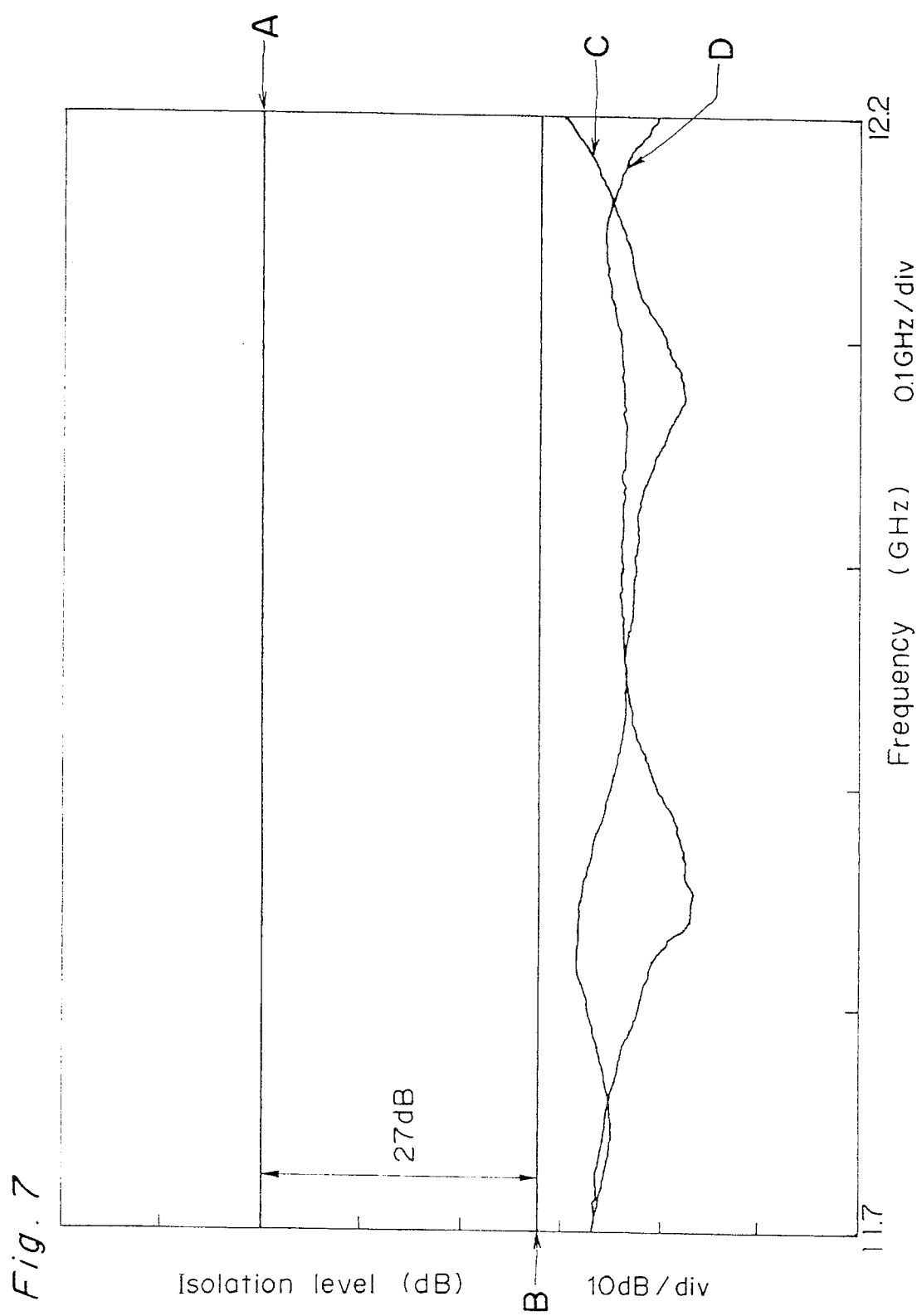
FIG. 7 is a view showing an example of data showing improvement in the isolation characteristic between a horizontally polarized wave signal and a vertically polarized wave signal.

FIG. 7 shows an example of data of improvement in isolation characteristic between a horizontally polarized wave signal and a vertically polarized wave signal according to the embodiment. In this example, an isolation of 30 dB or more has been attained, which is a substantial improvement over the specified isolation level of 27 dB. In the figure, reference character A represents a normalized desired wave signal reception level, while B represents a level 27 dB lower than the level of A, a reference line that discriminates whether or not the signal level meets the specification. C represents a reception level of a horizontally polarized wave signal when a vertically polarized wave signal is received, showing that the value of reception level is at a level about 30 dB lower than A and that the isolation attains to 30 dB. Also, D represents a reception level of a vertically polarized wave signal when a horizontally polarized wave signal is received, where it can be understood that the value of reception level is 30 dB or more lower than A and that the isolation attains to 30 dB or more.

In the above-described embodiment, the present invention may be applied to converter circuits for receiving two mutually different arbitrary signals without being limited to the applications of reception of the European ASTRA satellite and U.S. Ku-band satellite.

In the above-described embodiment, the first and second LNAs 1a, 1b, 11a, 11b as HEMT units have been arranged to be low-noise amplifiers of circuitry containing HEMTs. However, the HEMT units may also be composed of only one HEMT. Otherwise, the HEMT units may be amplifiers using semiconductor devices other than HEMTs.

In the above-described embodiment, the first and second HEMT mixers 3, 13 as HEMT mixers have been provided by circuitry containing HEMTs, capacitors, and resistors. However, it is a matter of course that the HEMT mixers are not limited to these ones. The HEMT mixers may also be active mixers using semiconductor devices other than HEMTs, which have a conversion gain.

In the above-described embodiment, the band-pass filters using a ring filter have been used as the directional filters 4, 14. However, it is needless to say that the band-pass filters are not limited to directional filters.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A converter circuit comprising:

two first high electron mobility transistor units connected in series to each other;

a first band-pass filter for eliminating signals of a specified band from a signal received from a latter-stage of said two first high electron mobility transistor units;

a first high electron mobility transistor mixer for converting a signal derived from said first band-pass filter which does not include the signals of the specified band into a first intermediate frequency signal as an output thereof;

a first directional filter for supplying oscillator power to said first high electron mobility transistor mixer;

two second high electron mobility transistor units connected in series to each other;

a second band-pass filter for eliminating signals of the specified band from a signal received from a latter-stage of said two second high electron mobility transistor units;

a second high electron mobility transistor mixer for converting a signal derived from said second band-pass filter which does not include the signals of the specified band into a second intermediate frequency signal as an output thereof; and a second directional filter for supplying oscillator power to said second high electron mobility transistor mixer.

2. The converter circuit according to claim 1, wherein said two first and two second high electron mobility transistor units are amplifiers and said first and second high electron mobility transistor mixers are active mixers having a conversion gain.

3. The converter circuit according to claim 1, wherein said first and second directional filters are band-pass filters.

* * * * *